United States Patent [19]

Sexton

[11] Patent Number: 5,790,382
[45] Date of Patent: Aug. 4, 1998

[54] STIFFENED PRINTED CIRCUIT BOARD

[75] Inventor: Eric T. Sexton, Budd Lake, N.J.

[73] Assignee: Lucent Technologies Inc., Murray Hill, N.J.

[21] Appl. No.: 578,122

[22] Filed: Dec. 26, 1995

[51] Int. Cl.[6] .................................................. H05K 1/00
[52] U.S. Cl. ............................. 361/756; 439/59; 439/62
[58] Field of Search ............................ 439/59, 60, 61, 439/62, 81, 82, 78; 174/250; 361/741, 756, 801, 802

[56] References Cited

U.S. PATENT DOCUMENTS

| | | | |
|---|---|---|---|
| 3,567,998 | 3/1971 | Ammerman | 317/101 |
| 4,377,315 | 3/1983 | Grau | 339/17 R |
| 4,857,000 | 8/1989 | Van Domelen | 439/64 |
| 5,398,154 | 3/1995 | Perkins et al. | 361/212 |
| 5,454,725 | 10/1995 | Speiser et al. | 439/61 |
| 5,469,332 | 11/1995 | Alvité | 361/737 |
| 5,505,628 | 4/1996 | Ramey et al. | 439/76.1 |
| 5,573,408 | 11/1996 | Laub et al. | 439/62 |

*Primary Examiner*—Laura Thomas

[57] ABSTRACT

A relatively large printed circuit board includes a pair of stiffening members for preventing bending of the board during handling. The stiffening members are disposed along opposite sides of the board and include edge portions abutting against the board side surfaces and forming planar side extensions of the board. The member edge portions adjoin lateral extensions which are off-set from the plane of the edge portions and which lie flat against a substrate major surface and there secured to the substrate. A beam is rigidly secured to the lateral extension of each member by means of spaced apart posts. The beam overlies the lateral extension and functions, in combination with the lateral extension and post, as a lattice-type I-beam.

11 Claims, 4 Drawing Sheets

STIFFENED PRINTED CIRCUIT BOARD

BACKGROUND OF THE INVENTION

This invention relates to printed circuit boards, and particularly to circuit boards of such large size as to require mechanical stiffening.

Printed circuit boards typically comprise a rigid substrate of a dielectric material on which electrical components are mounted. A "printed" pattern of electrical conductors is provided on the substrate electrically interconnecting the various components to one another and to one or more sockets on the board by means of which the components on the board can be electrically connected to circuits external of the board.

The present invention is primarily concerned with printed circuit boards of relatively large size used in "circuit pack assemblies." Such assemblies typically comprise a flat plate (the dielectric "board") of a rigid, plastic-like material, e.g., a hardened epoxy, and various electrical components and hardware mounted on the flat plate. Such circuit pack assemblies are used in large electrical apparatus, e.g., telephone switching circuits, and are removably mounted within slots in a "card cage" portion of the electrical apparatus.

In one such use, the "front" end of a pack assembly board is inserted into a slot in a card cage and pushed forwardly until a socket (or sockets) on the front end of the board mates with a corresponding socket (or sockets) mounted at the inner end of the slot. For both supporting the weight of the circuit pack assembly as well as for guiding the board during the insertion process, the slot includes a pair of front to back extending grooves into which side edges of the board are inserted. The side edges of the board rest on horizontally extending side walls of the grooves. However, the design of existing card cages is such that the grooves are not continuous from front to back of the card cage slot but include gaps where the side edges of the board are not supported. This presents no problem while the circuit pack assemblies are fully inserted within the slots, but presents a problem during the assembly insertion process. Thus, owing to the large size and weight of the component mounted circuit pack assembly, when the leading ends of the board side edges exit portions of the slot grooves positioned towards the front of the card cage, the front end of the board tends to downwardly bend or droop. Then, when the front ends of the board side edges reach the next section of the slot grooves, the board front end, now depressed below the plane of the groove horizontally extending side walls, abuts against end faces of the grooves and tends to jam the assembly against further insertion.

Usually, a bit of jiggling of the circuit pack assembly by an operator inserting the assembly suffices to solve the problem. However, the poor fit of the assemblies within the slots is annoying, is time consuming, can lead to damage of the assemblies and, in rare instances, can prevent full and proper insertion of a circuit pack assembly into its card cage slot.

The problem is likely easily avoided in the design of new electrical apparatus. However, existing apparatus are widely used and the present task is to solve the problem within the constraints of existing designs and interfitting relationships. One constraint, for example, is the dimensions of the existing card cages and the corresponding dimensions of the circuit pack assemblies. Thus, while changes can be made to the circuit pack assemblies, the assemblies must still properly fit within the card cage slots. Also, existing circuit pack assemblies are, generally, densely loaded with electronic components with very little unused board area and in carefully designed spacial relationships among the components. Preferably, any alterations of the circuit pack assemblies should not alter the mounting of the components on the boards. Still another constraint is that, for purpose of heat removal, cooling air is circulated through the card cage and around all the circuit pack assemblies. Again, any alterations of the circuit pack assemblies should not interfere with existing air flow patterns within the card cage.

During investigation of the matter, a further problem somewhat unrelated to the foregoing was discovered. The flat epoxy panels used in the fabrication of printed circuit boards are commercially available in certain standard dimensions. Over-sized boards are purchased and, in a first processing step, are cut to the desired dimensions, e.g., 13.374 by 12.17 inches. The commercially available boards closest to the desired dimension are 23 by 16.575 inches, i.e., just slightly less than twice the width of the cut boards. Accordingly, in the cutting operation, practically one-half of the purchased board is discarded as waste. The purchased boards are relatively expensive, e.g., around $200.00 per board and, in the aforedescribed process, almost half the cost of the boards is thrown away (less any small scrap value). The present invention avoids such wastage.

SUMMARY OF THE INVENTION

A printed circuit board comprises a plate-like substrate having oppositely disposed front and rear ends and a stiffening member disposed along one side edge of the substrate and extending substantially the full length of the substrate. In a preferred embodiment, two stiffening members are present, one along each substrate side edge. Each stiffening member incudes a plate-like edge portion lying in the plane of the substrate along a side edge thereof and forming a side edge extension of the substrate. The edge portion of the stiffening member is connected to a laterally extending portion extending inwardly of the side edge of the substrate and secured to the substrate side edge, e.g., by screws. The inner end of the laterally extending portion is rigidly connected to a beam spaced from but overlying and generally coextensive with the laterally extending portion. The combination of the rigidly connected but spaced apart laterally extending portion and beam functions similarly as an I-beam for stiffening the substrate.

DESCRIPTION OF THE PREFERRED EMBODIMENTS OF THE INVENTION

As mentioned, circuit pack assemblies are commonly used within "card cages" of electrical apparatus. Schematic illustrations of a card cage 10 containing a number of known circuit pack assemblies 12 are provided in FIGS. 1 and 2.

Figure 1:
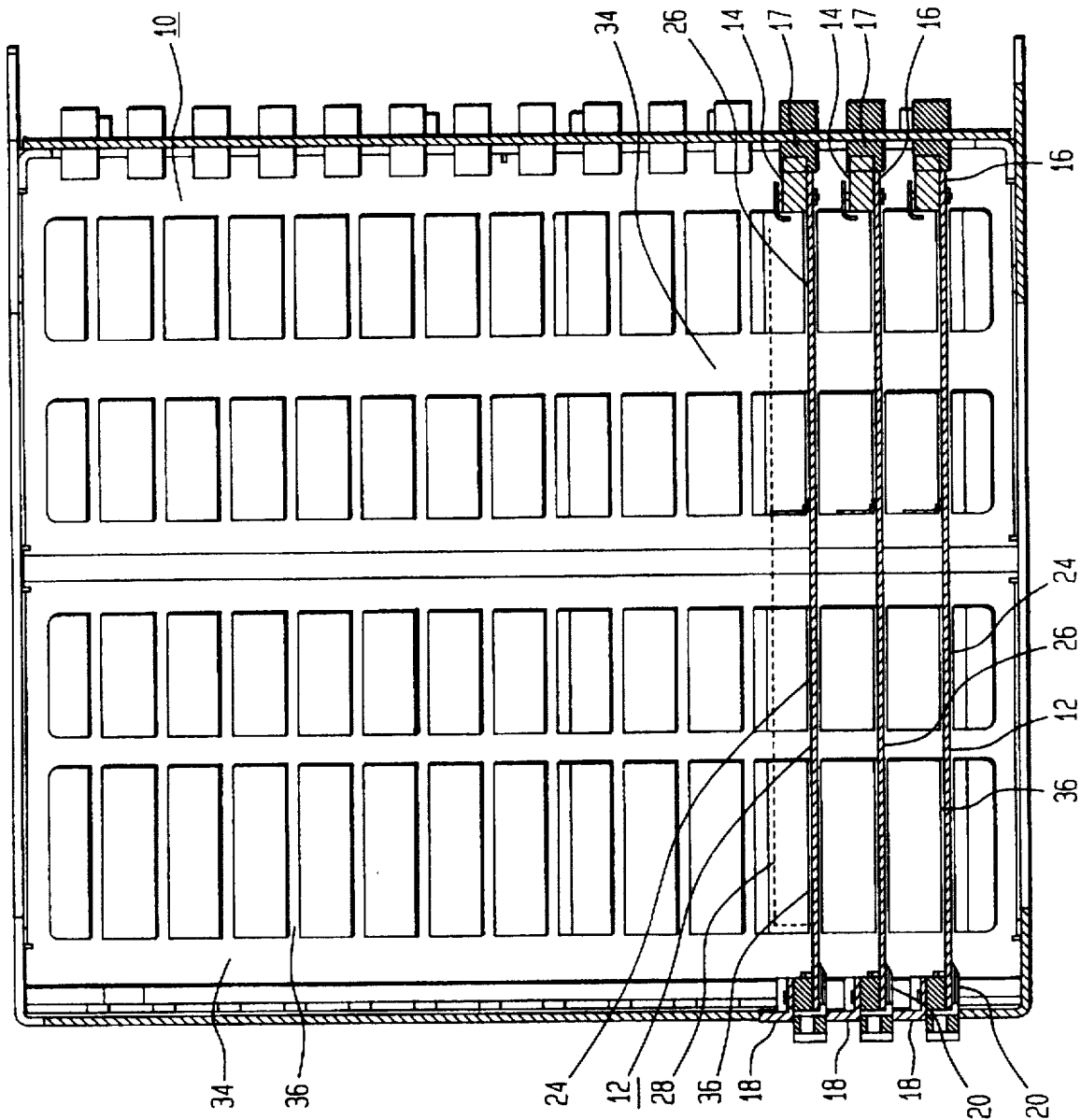
FIG. 1 is a schematic, side sectional view of a known card cage portion of an electrical apparatus including three circuit pack assemblies mounted therewithin.

FIG. 1 shows a number of assemblies 12 stacked one above the other in spaced apart relationship within the card cage 10. The vertical spacing between the circuit pack assemblies is to allow free flow of cooling air around the assemblies. Typically, each assembly 12 includes at least one socket 14 at its "front" end 16 which is mated with a corresponding socket 17 mounted at the inner end of a "slot" (i.e., a front to back rectangular space) in the card cage in which is removably disposed a circuit pack assembly. Each assembly also includes a "face plate" 18 disposed at its "rear end" 20. The face plates 18 of adjacent assemblies 12 fit relatively closely together and combine to form an end wall of the card cage. Additionally, each assembly further includes a printed circuit board 24 carrying a number of electronic components electrically interconnected with each other and with the socket(s) 14 at the assembly front end by a pattern of conductors on a surface 26 of the board. Such components and conductors are inducted schematically by a dashed box 28 on the various assemblies (only one such "box" 28 being illustrated). Details of such components and conductors are omitted because they vary from application to application and are well known.

Figure 2:
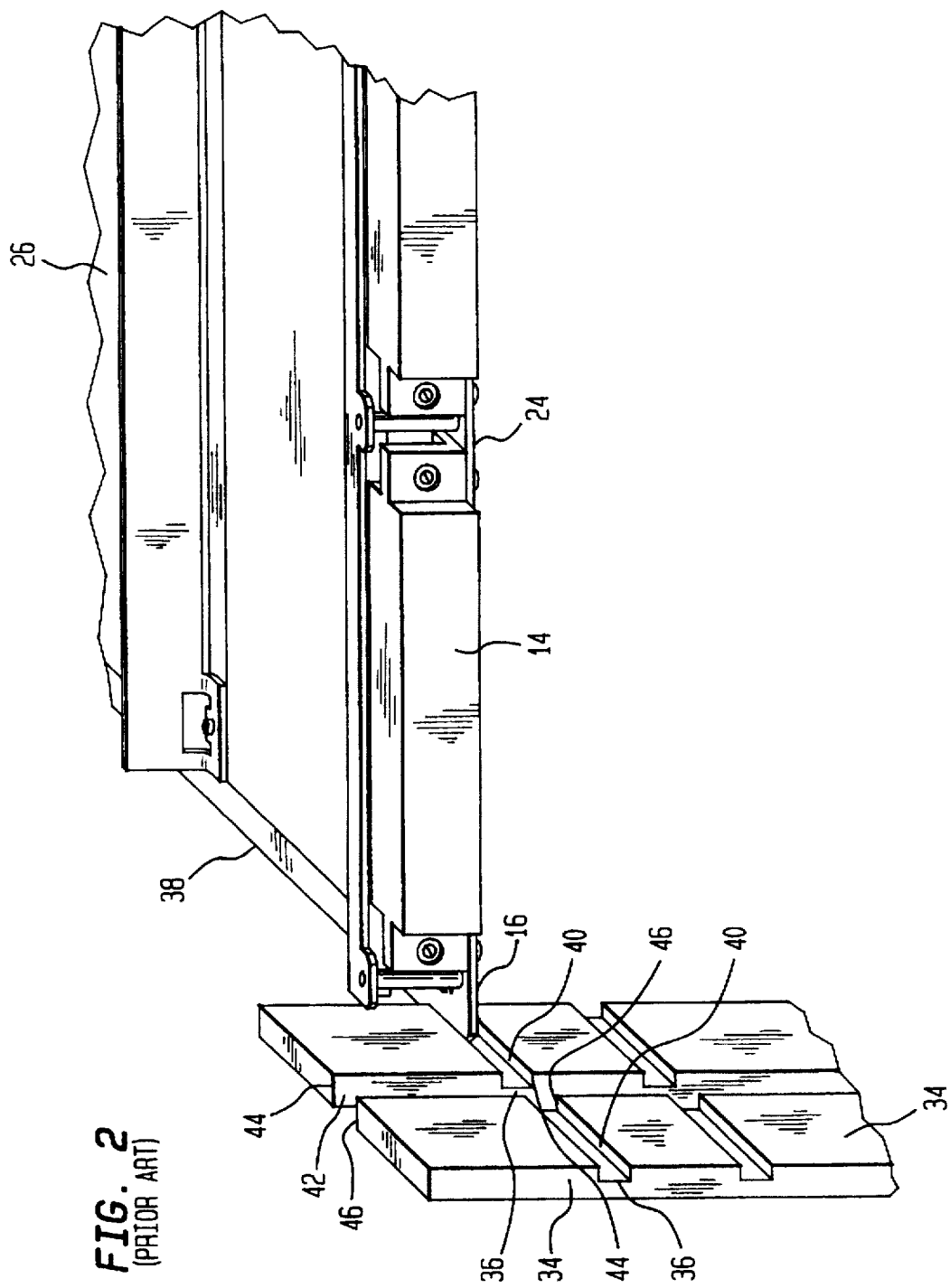
FIG. 2 is a perspective view of a portion of the apparatus shown in FIG. 1 showing a grooved side wall of the card cage and the front end of a circuit pack assembly being inserted into the card cage.

Preferably, the individual assemblies 12 are readily insertable within and removable from the card cage for purposes of repair and re-programming. To this end, as well as for supporting the weight of the assemblies, each card cage slot includes a pair of oppositely disposed side walls 34 (only one wall 34 being shown in FIGS. 1 and 2) each including a horizontally extending groove 36. As shown in FIG. 2, side edges 38 of the assembly boards 24 fit within the grooves 36 and rest on horizontally extending groove side walls 40. Preferably, for preventing vibration of the assemblies 12 within the card cage 10, the board edges 38 fit relatively snugly within the grooves. For example, the board is 0.062 inches thick and the groove is 0.075 inches wide (i.e., high" as illustrated).

The design of the slots in existing card cages (e.g., in telephone data switches such as AT&T's BNS-2000) is such that the grooves 36 are discontinuous from front to back, and include gaps 42 between successive portions of the grooves. Such gaps, provided for reasons of no relevance to the present discussion, were not recognized as a source of a problem in the use of the apparatus. Such problem occurs during insertion of the circuit pack assemblies in that, owing to the relatively snug fit between the grooves 36 and the side edges 38 of the boards 24, any slight drooping of the leading end 16 of a board over the space between the rear end 44 of one groove portion and the front end 46 of a successive groove portion can cause misalignment between the board front end 16 and the groove portion opening 46. Thus, smooth insertion of the assemblies is interfered with.

Figure 3:
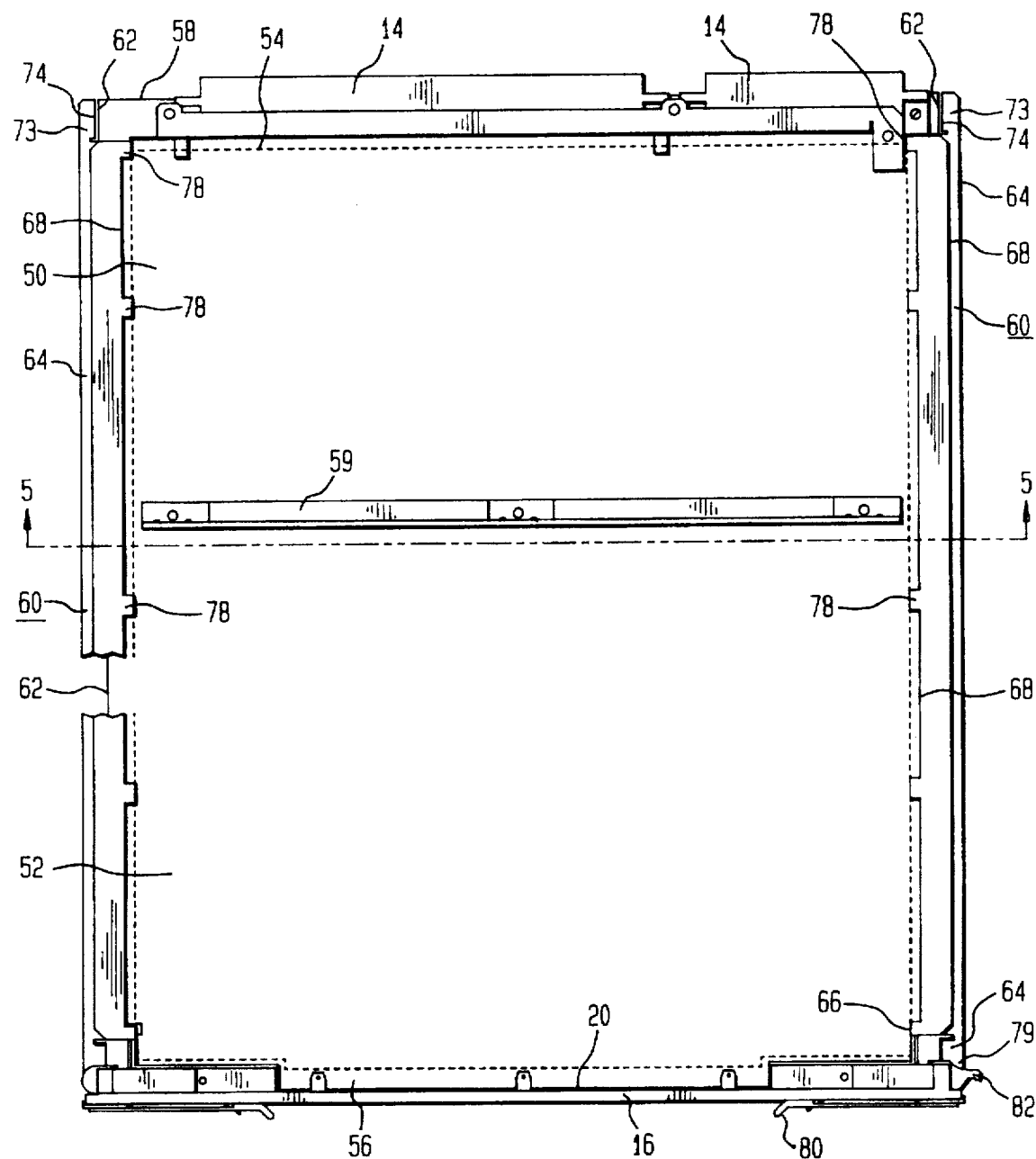
FIG. 3 A plan view of a circuit pack assembly in accordance with the present invention.
Figure 5:
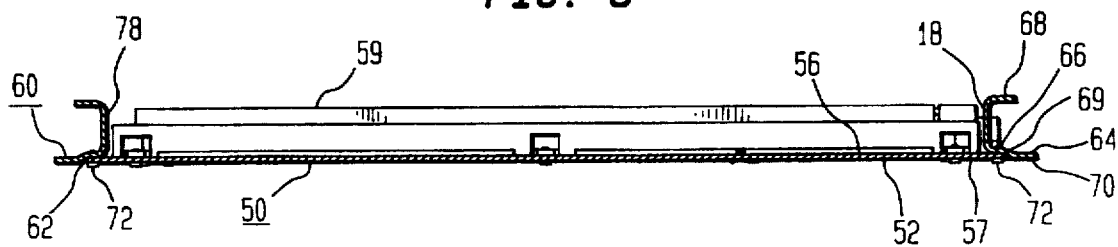
FIG. 5 is a sectional view of the assembly shown in FIG. 3 along line 5—5 thereof.
Figure 4:
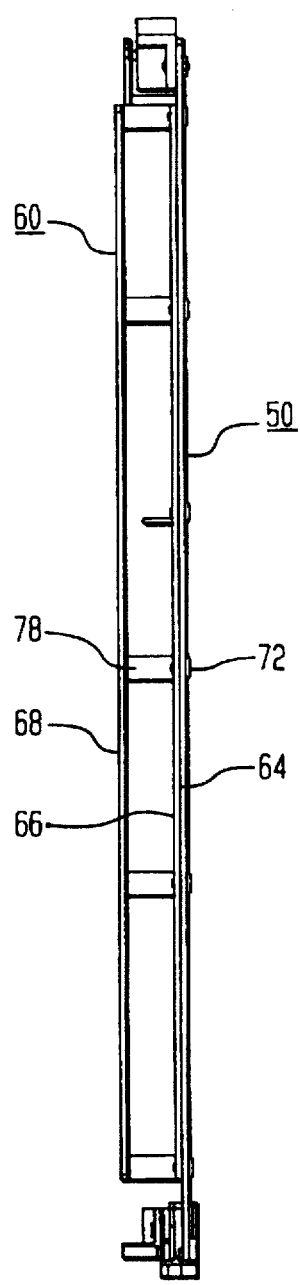
FIG. 4 is a side view of the assembly shown in FIG. 3 and looking in the direction of arrow A in FIG. 3.

A circuit pack assembly 50 in accordance with this invention, which solves the aforementioned problem while allowing direct substitution of the inventive assemblies 50 for existing assemblies in existing apparatus, is shown in FIGS. 3 through 5. The inventive assembly 50 can be identical to existing assemblies, including methods of fabrication, as follows.

The assembly 50 comprises a flat substrate 52 (FIGS. 3 and 5) of a dielectric material, e.g., hardened epoxy. Such substrates are commercially available. Mounted on the substrate 52 within an area designated by dashed lines 54 (FIG. 3) are a number of electrical components, e.g., IC's, resistors, capacitors, etc., which are electrically interconnected by a pattern of electrical conductors disposed on a top surface 56 (FIG. 5) of the substrate. Neither the assembly components nor the electrical conductors is illustrated as being known and commonly used. Various ones of the electrical components are connected to terminals of a known type socket 14 (FIG. 3) mounted on the "front" end 58 of the substrate. As previously noted, the function of the socket 14 is to provide electrical connections between components on the assembly 50 with electrical circuits external to the assembly. Additionally, an L-shaped stiffening beam 59 is rigidly secured to the substrate 52, as by screws. Mounted on the "rear" end 20 of the substrate 52 is the aforementioned faceplate 16.

Differences between the inventive assembly 50 and prior known assemblies are now described.

The dielectric substrate 52 is slightly less wide than the dielectric substrates in the prior assemblies. For example, the width of the dielectric substrate is 11.45 inches rather than the 12.17 inches heretofore used. The width selected is not arbitrary, but is preferably exactly equal to one-half the width (e.g., the aforementioned 23 inches) of commercially available epoxy substrates minus the width of the cutting tool. Accordingly, purchased substrates are cut in half to provide two assembly substrates without wastage of material. A problem thus created however, and the reason such avoidance of wastage was not previously practiced, is that the resulting substrates are less wide than the prior art substrates and not useable in direct replacement of prior art boards in assemblies of pre-established dimensions. This problem is solved by the use of the inventive stiffening members new described.

Preferably, for reason of maximum stiffening, two stiffening members 60 are used along respective side edges 62 (FIGS. 3 and 5) of the substrates 52. (In FIG. 3, a portion of left-hand stiffening member 60 is broken away to show the underlying substrate edge 62.)

It is convenient to describe the stiffening members 60 as including three portions; namely (FIG. 5), a side edge portion 64, a laterally extending portion 66, and a beam 68. For maximum strength, the stiffening members are preferably made of metal, e.g., steel, and can be formed using known metal stamping and forming processes.

The side edge portions 64 of the stiffening members 60 are disposed along the side edges 62 of the dielectric substrate 52 and serve as edge extensions thereof. To this end, the edge portions 64 have a thickness equal to that of the substrate (e.g., the aforementioned 0.062 inches) and are co-planar with the substrate 52. By "co-planar" is meant that the major surfaces of the substrate 52 (the aforementioned top surface 56 and its opposite surface 57) and the corresponding top surface 69 (FIG. 5) and bottom surface 70 of the edge portions 64 are respectively co-planar. The widths of the stiffening member edge portions 64 are selected to bring the combined width of the assembly board to that of the prior assembly board. In the present illustrative example, each of the edge portions 64 has a width of 0.36 inches which, when added to the aforementioned width of 11.45 inches of the dielectric substrates, equals the width of the prior used circuit pack assemblies of 12.17 inches.

The stiffening members 60 are rigidly secured to the dielectric substrates 52 by known fastening means, preferably machine screws 72, which extend through openings (not visible in the drawing) drilled through the substrates along the side edges thereof and which are screwed into tapped openings through the laterally extending portions 66 of the stiffening members. As shown in FIG. 5, the laterally extending portions 66 of the stiffening members 60 are extensions of the edge portions 64 and extend inwardly of the side edges 62 of the dielectric substrate 52. The portions 66 are off-set from the plane of the portions 64 by an amount equal to the thickness of the substrate so that, when the lateral portions 66 are tightly secured against the surface of the substrate 52 (by the aforementioned screws 72), the edge portions 64 of the stiffening members 60 are disposed co-planar with the substrate 52. Preferably, the lateral portions 66, while generally coextensive in length with the edge portions 64, terminate short of end portions 73 (top of FIG. 3) of the stiffening members 60. Such end portions 73 have inner edges 74 which abut directly against side edges 62 of the substrate. (For ease of viewing, a small space is shown, at the upper left-hand corner of the assembly between the otherwise abutting edges 62 and 74 of the substrate and stiffening member portion 73, respectively.)

The stiffening member 60, to the extent so far described, i.e., comprising the side edge portion 64 and the laterally extending portion 66, is generally adequate to perform its function. Thus, being of, e.g., steel, rather than of epoxy, it stiffens the assembly board against bending along an axis perpendicular to the side edges of the substrate 62. Also by forming side edges of the assembly board, the stiffeners allow the use of epoxy substrates which are more narrow than those formerly used and not greater than one-half the width of commercially available epoxy substrates. Thus, two substrates, rather than one, can be cut from the purchased substrates thereby reducing waste.

Significantly greater strength against bending, however, is provided by the addition of the beam 68 to the stiffening member 60. The beam 68 substantially exactly overlies the laterally extending portion 66 and is rigidly secured thereto by means of spaced apart posts 78. In the illustrative example, five posts 78 are present which are preferably integral with the other portions of the stiffening member 60. In combination, the laterally extending portion 66, the supporting post 78, and the beam 68, functions as an I-beam having great resistance to bending.

While I-beams typically comprise continuous plates of metal (in contrast to the spaced apart posts 78 used in the stiffening members 60), a quite substantial increase in stiffening is provided by the post supported beam 68. The advantage of using spaced apart posts rather than a continuous plate is that air can pass freely through the stiffening member 60 between the beam 68 and the other portions 64 and 66 thereof. As previously noted, cooling air is circulated within the card cage, and a critical requirement in any modification of the prior used assemblies is that such circulation is not impaired.

The height of the stiffening member 60 above the surface 56 of the substrate 52 is compatible with the normal space provided between stacked circuit pack assemblies within the card cage, e.g., 1 inch.

As mentioned, the beam 68 substantially exactly overlies (FIGS. 3 and 5) the laterally extending portion 66 of the stiffening member and does not overlie the side edge portion 64 of the stiffening member. In use, the side edge portions 64 are received within the grooves 36 (FIG. 2) along the sides of the card cage slots, and the beam 68 is laterally off-set from the side edge portions 64 to allow free movement of the side edge within the grooves without contact of the beam against the groove walls.

A further advantage provided by the stiffening members 60 is now described.

As mentioned, the circuit pack assemblies are removably disposed within the card cage. A potential problem is that static electricity carried by a person in the process of engaging and removing a circuit pack assembly can damage electrical components on the assembly. This problem is largely avoided by grounding the portion, i.e., the faceplate 16, of the assembly first contacted by the servicing person. This is done by means of a spacing clip mounted on the faceplate and which is electrically connected to the card cage. On occasion, however, a poor contact is made between the spring clip and the card cage and the static electricity is not adequately discharged to ground.

The stiffening members 60, however, make large area and positive contacts with the card cages, via the grooved side walls 34 (FIGS. 1 and 2) thereof, and with metal walls 34 and metal stiffening members 60, excellent electrical contacts are made between the members 60 and the card cage. The stiffening members 60 are thus extended, as shown in FIG. 3, to underlie and be electrically connected to a metal latch means 80 (including a metal latch hook 82) mounted on the faceplate 16. Accordingly, excellent and reliable grounding of the faceplate 16 is obtained.

What is claimed is:

1. An assembly comprising a circuit board comprising a plate-like, dielectric material substrate having a uniform thickness, front and rear ends, oppositely disposed sides extending between said front and rear ends, and oppositely disposed major surfaces bounded by said ends and sides, and a first stiffening member rigidly secured to said substrate along one of its sides, said member including two portions extending co-extensively along said one side, one of said portions forming a first side extension of said substrate, having a thickness substantially equal to said substrate and having oppositely disposed major surfaces substantially co-planar with respective major surfaces of said substrate, and the other of said portions overlying said substrate along said one side and being rigidly secured to said substrate.

2. An assembly according to claim 1 for insertion within a card cage having a pair of spaced apart support walls each containing a groove extending in a front to rear direction of the card cage, said-assembly being insertable into said card cage by means of side edges of said assembly being slidably disposed within respective grooves in said support walls, a second stiffening member substantially identical to said first stiffening member rigidly secured to said substrate along the other of said sides and forming a second side extension of said substrate, said side extensions of said substrate being of metal and comprising said side edges of said assembly.

3. An assembly according to claim 2 wherein said support walls of said card cage define an open space between surfaces of said walls facing towards one another, said grooves in said walls opening into respective said surfaces and having depth dimensions in directions facing away from said open space, the other of said portions of said stiffening members being disposed on said assembly inwardly of said side extensions for being disposed within said open space and spaced from the surfaces of said side walls when said assembly is inserted into said card cage.

4. An assembly according to claim 1 wherein said stiffening member is of a metal and said substrate is of an epoxy.

5. An assembly according to claim 1 wherein said one portion of said member extends substantially the full length of said substrate between said ends thereof.

6. An assembly according to claim 1 wherein said other of said portions is integral with said one portion and is off-set from the plane of said one portion a distance equal to the thickness of said substrate.

7. An assembly according to claim 6 wherein opposite ends of said one portion extend beyond corresponding ends of said other portion thereby exposing side surfaces of said one portion, said one portion side surfaces abutting against corresponding side surfaces of said substrate along said one side thereof.

8. An assembly according to claim 1 wherein said member includes a beam rigidly secured to said other portion and disposed in spaced apart, overlying relationship with said other portion.

9. An assembly according to claim 8 wherein said beam is rigidly secured to said other portion by a plurality of spaced apart posts along the length of said other portions, said posts being separated by open spaces allowing passage of a cooling fluid in the space between said beam and said other portion and in a direction between said posts.

10. An assembly according to claim 9 wherein said posts are disposed along an edge of said other portion, facing away from said one portion, said beam having a first edge facing away from said posts and towards said one portion, and said one portion having an outer edge facing away from said other portion and being disposed laterally beyond said beam first edge.

11. An assembly according to claim 4 for being removably mounted within an apparatus, said board including an electrically conductive latch means for latchingly securing said board within, and electrically interconnecting said board to, said apparatus, and said stiffening member being electrically connected to said latch means.

* * * * *